(12) United States Patent
Cai et al.

(10) Patent No.: US 12,308,085 B2
(45) Date of Patent: May 20, 2025

(54) RECONFIGURABLE MBIST METHOD BASED ON ADAPTIVE MARCH ALGORITHM

(71) Applicants: Nanjing University Of Posts And Telecommunications, Jiangsu (CN); NANTONG INSTITUTE OF NANJING UNIVERSITY OF POSTS AND TELECOMMUNICATIONS CO., LTD., Jiangsu (CN)

(72) Inventors: Zhikuang Cai, Jiangsu (CN); Haojie Yu, Jiangsu (CN); Haijun Shen, Jiangsu (CN); Zushuai Xie, Jiangsu (CN); Jingjing Guo, Jiangsu (CN); Lu Liu, Jiangsu (CN); Jiafei Yao, Jiangsu (CN); Henglu Wang, Suzhou (CN); Zixuan Wang, Jiangsu (CN); Jian Xiao, Jiangsu (CN); Yufeng Guo, Jiangsu (CN)

(73) Assignees: Nanjing University Of Posts And Telecommunications, Jiangsu (CN); NANTONG INSTITUTE OF NANJING UNIVERSITY OF POSTS AND TELECOMMUNICATIONS CO., LTD., Jiangsu (CN)

( * ) Notice: Subject to any disclaimer, the term of this patent is extended or adjusted under 35 U.S.C. 154(b) by 0 days.

(21) Appl. No.: 18/277,382

(22) PCT Filed: Jan. 10, 2023

(86) PCT No.: PCT/CN2023/071579
§ 371 (c)(1),
(2) Date: Aug. 16, 2023

(87) PCT Pub. No.: WO2024/036881
PCT Pub. Date: Feb. 22, 2024

(65) Prior Publication Data
US 2025/0006289 A1    Jan. 2, 2025

(30) Foreign Application Priority Data
Aug. 19, 2022  (CN) .......................... 202210998070.5

(51) Int. Cl.
*G11C 29/12*     (2006.01)
*G11C 29/18*     (2006.01)
*G11C 29/36*     (2006.01)

(52) U.S. Cl.
CPC .......... *G11C 29/1201* (2013.01); *G11C 29/18* (2013.01); *G11C 29/36* (2013.01); *G11C 2029/3602* (2013.01)

(58) Field of Classification Search
CPC ..... G11C 29/1201; G11C 29/18; G11C 29/36; G11C 2029/3602
See application file for complete search history.

(56) References Cited

U.S. PATENT DOCUMENTS

| | | | | |
|---|---|---|---|---|
| 6,550,032 B1 * | 4/2003 | Zhao | ...................... | G11C 29/02 714/730 |
| 2003/0221146 A1 * | 11/2003 | Flynn | ...................... | G11C 29/16 714/718 |

(Continued)

FOREIGN PATENT DOCUMENTS

| | | |
|---|---|---|
| CN | 110570896 | 12/2019 |
| CN | 112071355 | 12/2020 |

(Continued)

OTHER PUBLICATIONS

"International Search Report (Form PCT/ISA/210) of PCT/CN2023/071579," mailed on Jun. 1, 2023, pp. 1-3.

(Continued)

*Primary Examiner* — Mohammed A Bashar
(74) *Attorney, Agent, or Firm* — JCIPRNET

(57) ABSTRACT

A reconfigurable MBIST method based on an adaptive March algorithm is provided. The reconfigurable MBIST method automatically reconfigures different algorithm circuits according to external environment and user instructions to satisfy detection requirements for different faults. The provided adaptive March algorithm is capable of adaptively reorganizing algorithms with different complexities, such that dynamic adjustments can be executed between time complexities of the algorithm and fault coverage rates (Continued)

to achieve a good balance, and the static fault coverage rates are high, thereby effectively improving dynamic fault coverage rates.

6 Claims, 8 Drawing Sheets

(56) References Cited

U.S. PATENT DOCUMENTS

| | | | |
|---|---|---|---|
| 2007/0204190 A1 | 8/2007 | Hesse et al. | |
| 2009/0265592 A1* | 10/2009 | Wu | G11C 29/02 |
| | | | 714/E11.177 |
| 2013/0019130 A1* | 1/2013 | Hakhumyan | G11C 29/36 |
| | | | 714/E11.169 |

FOREIGN PATENT DOCUMENTS

| | | |
|---|---|---|
| CN | 115083500 | 9/2022 |
| WO | 2019172746 | 9/2019 |

OTHER PUBLICATIONS

"Written Opinion of the International Searching Authority (Form PCT/ISA/237) of PCT/CN2023/071579," mailed on Jun. 1, 2023, with English translation thereof, pp. 1-9.

* cited by examiner

RECONFIGURABLE MBIST METHOD BASED ON ADAPTIVE MARCH ALGORITHM

CROSS-REFERENCE TO RELATED APPLICATION

This application is a 371 of international application of PCT application serial no. PCT/CN2023/071579, filed on Jan. 10, 2023, which claims the priority benefit of China application no. 202210998070.5, filed on Aug. 19, 2022. The entirety of each of the above-mentioned patent applications is hereby incorporated by reference herein and made a part of this specification

BACKGROUND

Technical Field

The present disclosure relates to the technology of testability design for integrated circuits, and particularly discloses a reconfigurable MBIST method based on an adaptive March algorithm, which belongs to the technical field of testing or measuring semiconductor devices during manufacturing or processing.

Description of Related Art

As the largest module and one of the most important modules in a chip, stabilities and reliabilities of memories are related to whether the overall chip can work normally. Especially now, when processes for chip manufacturing are increasingly advanced, the memories are extremely sensitive to changes in the external environment. Fluctuations of environmental parameters are serious challenges to stabilities of the memories, and the most typical environmental parameter is PVT (production processes, power supply voltages, and temperatures).

Memory built-in self test (MBIST) is the most widely used memory testing technology. A core of a MBIST circuit lies in testing algorithms, and selecting appropriate testing algorithms is crucial for testing qualities and testing efficiencies of the MBIST. Under different external or internal conditions of memories (such as temperatures, power supply voltages, clock frequencies and internal memory timings parameters), there might be different defects and different fault types. Especially in deep submicron technologies, the frequencies of open circuit defects and dynamic faults appear in resistors are increasing, which may cause testing evasions and bring incalculable credit losses and economic losses to clients. However, there is no testing algorithm that can consider all fault models simultaneously at present, and previous testing schemes always combined as many test sequences as possible into dynamic fault detection sequences, resulting in long testing time. Even some March test algorithms have at least one March element that contains five consecutive read operations, which is not applicable to detections on other faults. The disadvantages for doing this are obvious, and the disadvantages are that the number of operations to sensitize faults increases, which enables time complexities of the March testing algorithms to increase proportionally, and testing time to increase exponentially. In addition, limitations of the MBIST circuits on markets at present are that once the MBIST testing algorithms are selected and designed, these testing algorithms are fixed in a silicon chip and cannot be changed (unless an extremely complex BIST program is designed to support such operations). The above-mentioned problems stimulate demands for new testing algorithms and dedicated circuits for MBIST controllers to enhance fault coverage rates and improve testing efficiencies.

In order to improve the fault coverage rates of SRAM testing, the existing reconfigurable MBIST technologies select reconfigurable algorithm elements for the faults types that are prone to appear in low voltage environments, and then implant a designed reconfigurable algorithm into the silicon chip to form a reconfigurable algorithm circuit. A BIST circuit composed of the reconfigurable algorithm circuit and the March algorithm circuit selects the reconfigurable algorithm circuit or the March algorithm circuit to test the SRAM under functions of external control signals. The reconfigurable algorithm solidified before chip manufacturing cannot be adaptive to the fluctuations of the environmental parameters, and can merely test faults that are prone to appear in the SRAM under the low voltage environments, which are limited in improving the fault coverage rates. The introduction of a BIST reconfigurable algorithm circuit with a propose of implementing the reconfigurable algorithm increases circuit areas.

In conclusion, the existing reconfigurable MBIST technologies are not capable of being adaptive to the fluctuations of the environmental parameters, the covered fault types are limited, and the existing reconfigurable MBIST technologies need to increase the testing efficiencies at costs of increasing the time complexities of the testing algorithms and the circuit areas. The present disclosure aims to provide a reconfigurable MBIST method based on an adaptive March algorithm to eliminate the defects of the existing reconfigurable MBIST technologies.

SUMMARY

In view of the deficiencies in the above-mentioned background technologies, the objectives of the present disclosure are to provide a reconfigurable MBIST method based on an adaptive March algorithm. In this reconfigurable MBIST method, the adaptive environment parameters select March algorithm elements to realize the invention objectives of flexibly configuring the March algorithm elements, reducing algorithm time complexities and improving fault coverage rates, thus solving the technical problems of fixed algorithms built in circuits, low testing circuit flexibilities, low fault coverage rates, long testing time and high testing circuit area costs in the traditional MBIST testing.

In order to solve the above technical problems, the present disclosure provides the following technical solutions, provided are a new adaptive March Adapt-RAWC algorithm and a reconfigurable MBIST method based on an adaptive March algorithm. In order to cover $dRDF''$ faults that are difficult to be detected by the ordinary algorithms, the provided new algorithm introduces Hammer testing algorithm elements with multiple read operations: $\{\uparrow\downarrow(w0,r0'',r0); \uparrow\downarrow(w1,r1'',r1)\}$, and makes improvements based on the March C+ algorithm and the March RAW algorithm, integrating the advantages of these three algorithms, and adding a plurality of new read and write elements on the basis of including the three algorithm elements, such that the new algorithm can cover several dynamic faults better. Moreover, the adaptive algorithm can call the required algorithm elements under different environments or user instructions. For example, when calling the read and write elements of the March C+ algorithm, the overall time complexity of the algorithm is extremely low, when the environment is in a situation where a plurality of dynamic faults are prone to occur, the time costs or the user specified algorithms are not considered, the reconfigurable circuits adjust the algorithmic state machine, reconfigure the circuits, retrieve the testing algorithm elements with relatively high complexities to detect a plurality of dynamic faults that are difficult to be detected.

The new adaptive March Adapt-RAWC algorithm includes March Adapt-RAWC1 and March Adapt-RAWC2.

The specific descriptions of the March Adapt-RAWC1 algorithm are that:

{↑↓(w0); ↑(r0,w0,r0″,r0,w1,r1); ↓(r1,w1,r1″,r1,w0,r0); ↓(r0,w0,r0,r0,w1,r1); ↓(r1,w1,r1,r1,w0,r0); ↑↓(r0)}.

The specific descriptions of the March Adapt-RAWC2 algorithm are:

{↑↓(w0); ↑(r0,w0,w0,r0″,r0,r0,w0,r0,w1,r1); ↑(r1,w1, w1,r1″,r1,r1,w1,r1,w0,r0); ↓(r0,w0,w0,r0,r0,r0,w0,r0,w1, r1); ↑(r1,w1,w1,r1,r1,r1,w1,r1,w0,r0); ↑↓(r0)}.

The classic March C+ testing algorithm is:

{M0: ↑↓(w0); M1; ↑(r0,w1,r1); M2; Ξ(r1,w0,r0); M3; ↓(r0,w1,r1); M4; ↓(r1,w0,r0); M5; ↑↓(r0)}; where M0 is the testing step for the initial write operation, M1, M2, M3 and M4 are the testing steps for sequentially reading and writing the storage units, M1 and M2 are the testing steps for reading and writing the storage units in an ascending order, M3 and M4 are the testing steps for reading and writing the storage units in a descending order, and M5 is the testing step for reading the testing data.

The March Adapt-RAWC1 algorithm is that Hammer testing algorithm elements {↑(w0,r0″,r0); ↑(w1,r1″,r1)} are inserted after the first read operation of M1, M2, M3 and M4 testing steps in a classic March C+ testing algorithm. In order to reduce the time complexities, the number of times n for repeating the Hammer testing algorithm elements inserted after the first read operation of M3 and M4 testing steps is set to 1, that is, {↑(w0,r0,r0); ↑(w1,r1,r1)} are inserted after the first read operation of the M3 and M4 testing steps.

The March Adapt-RAWC1 algorithm can further be that the Hammer testing algorithm elements {↓(w0,r0n, r0); ↓(w1,r1n,r1)} are inserted after the first read operation of M1, M2, M3 and M4 testing steps in a classic March C+ testing algorithm. In order to reduce the time complexities, the number of times n for repeating the Hammer testing algorithm elements inserted after the first read operation of M1 and M2 testing steps is set to 1, that is, {↓(w0,r0, r0); ↓(w1,r1,r1)} are inserted after the first read operation of the M1 and M2 testing steps. The March Adapt-RAWC1 algorithm can be described as: {↑↓(w0); ↑(r0,w0,r0,r0,w1, r1); ↑(r1,w1,r1,r1,w0,r0); ↓(r0,w0,r0n,r0,w1,r1); ↓(r1, w1,r1n,r1,w0,r0); ↑↓(r0)}. The present disclosure compares PVT parameters with a fault model library to determine fault prone types under current PVT parameters, selects a March algorithm that covers the fault prone types under the current PVT parameters, and generates algorithm element selection signals for reconfiguring the March algorithm. The present disclosure can further generate the algorithm element selection signals for reconfiguring the March algorithm according to the March algorithm that is selected by the user-defined instructions. The number of times n for repeating read and write operations in the Hammer elements that are added by the present disclosure is set according to the set R_Times.

March Adapt-RAWC2 is that Hammer testing algorithm elements {↑↓(w0,r0″,r0); ↑↓(w1,r1″,r1)} are inserted after the first read operation of testing steps for sequentially reading and writing storage units in a classic March C+ testing algorithm, and read and write operations are added at the front and the rear of the Hammer testing algorithm elements. That is, a plurality of testing elements are additionally added to the March Adapt-RAWC2 algorithm on the basis of the March Adapt-RAWC1. When the Hammer testing algorithm elements {↓(w0,r0″,r0); ↓(w1,r1″,r1)} are inserted after the first read operation of testing steps for sequentially reading and writing storage units in a classic March C+ testing algorithm, and read and write operations are added at the front and the rear of the Hammer testing algorithm elements, the March Adapt-RAWC2 algorithm can be described as {↑↓(w0); ↑(r0,w0,w0,r0,r0,r0,w0,r0, w1,r1); ↑(r1,w1,w1,r1,r1,r1,w1,r1,w0,r0); ↓(r0,w0,w0,r0″, r0,r0,w0,r0,w1,r1); ↓(r1,w1,w1,r1″,r1,r1,w1,r1,w0, r0); ↑↓(r0)}. When the Hammer testing algorithm elements {↑(w0,r0″,r0); ↑(w1,r1″,r1)} are inserted after the first read operation of testing steps for sequentially reading and writing storage units in a classic March C+ testing algorithm, and read and write operations are added at the front and the rear of the Hammer testing algorithm elements, the March Adapt-RAWC2 algorithm can be described as {↑↓(w0); ↑(r0,w0,w0,r0″,r0,r0,w0,r0,w1,r1); ↑(r1,w1,w1, r1″,r1,r1,w1,r1,w0,r0); ↓(r0,w0,w0,r0,r0,r0,w0,r0,w1, r1); ↓(r1,w1,w1,r1,r1,r1,w1,r1,w0,r0); ↑↓(r0)}. The testing algorithm executed by the March Adapt RAWC2 algorithm when selecting Hammer test elements is an improved March RAW testing algorithm that integrates Hammer nR testing algorithm elements. The improved March RAW testing algorithm that integrates Hammer nR testing algorithm elements executes two consecutive write operations and at least three consecutive read operations in the testing steps for sequentially reading and writing storage units, which is capable of detecting dRDF″ and dCFdsww that cannot be detected by the classic March RAW algorithm and improving the coverage rates of the faults on dDRDF, dWDF, dCFdrd, and dCFwd, and the fault coverage rates are greater than that of the March Adapt-RAWC1. Due to the excessive number of elements in the March Adapt-RAWC2 algorithm, the detailed descriptions is redundant, considering that the basis algorithm element structures of the March Adapt-RAWC2 are similar with that of the March Adapt-RAWC1, and therefore, the March Adapt-RAWC1 is mainly used as an example to expand the descriptions of the algorithm functions, and the implementation effects of the present disclosure are calculated based on the testing results of the March Adap-RAWC2 in the descriptions of the present disclosure. The differences between the functions of the March Adapt-RAWC1 and the March Adapt-RAWC2 is mainly reflected in the fact that the March Adapt-RAWC2 is capable of covering the dynamic faults such as dDRDF, dWDF, dCFdsww, dCFdrd and dCFwd more comprehensively because of the new added read and write elements.

The present disclosure further discloses a novel description method for the March algorithm, which innovatively describes the fixedly-executed algorithm elements in a bold manner on the basis of retaining the classic memory testing algorithm symbols. The letter "n" added in the upper right corner of the reading element represents the configurable number of times of read and write by the users, to highlight that the number of times n for repeating read operations in the Hammer testing elements is configurable by this representation, such that the requirements of the targeted detections for dynamic read interference faults can be satisfied under special conditions, without affecting the overall algorithm running time in general testing conditions.

It should be specially noted that the bold testing elements are elements of the classic March C+ algorithm, while the remaining elements are optional. When the algorithm element selection signals merely select the testing elements that represent in bold in the testing steps, the March Adapt-RAWC1 algorithm is the classic March C+ testing algorithm. When the algorithm element selection signals select all elements that represent in bold and elements that not represent in bold, and the set value for n is greater than 1, the element $r0^n$ constitutes the Hammer nR testing algorithm elements alone ("nR" represents n times of read operations). The March Adapt-RAWC1 algorithm is a March RAW testing algorithm that integrates the Hammer nR testing algorithm elements, which can better cover dynamic faults $dRDF^n$. When the algorithm element selection signals select all elements that represent in bold and elements that not represent in bold, and the set value for n is 1, the algorithm elements of the March Adapt-RAWC1 and March RAW are the same. The bold algorithm elements in the specific descriptions of the algorithms are shared testing elements among different algorithms, which are reflected as the reusable test state in the reconfigurable state machine. The areas of the reconfigurable MBIST circuits are saved because of the reuses and sharings of the testing algorithm elements.

When the algorithm element selection signals merely select the testing elements that represent in bold in the testing steps, the March Adapt-RAWC2 algorithm is the classic March C+ testing algorithm. When the algorithm element selection signals select all elements that represent in bold and elements that do not represent in bold, and the set value for n is 1, March Adapt-RAWC2 is an improved March RAW testing algorithm that covers dynamic read and write faults such as dDRDF, dWDF, dCFdsww, dCFdrd, and dCFwd, while the classic March RAW testing algorithm can not cover $dRDF^n$ and dCFdsww, and can not fully cover dynamic faults such as dDRDF, dWDF, dCFdrd, and dCFwd. When the algorithm element selection signals select all elements that represent in bold and elements that do not represent in bold, and the set value for n is greater than 1, March Adapt-RAWC2 is an improved March RAW testing algorithm that integrates the Hammer nR testing algorithm elements, which can excellently cover dynamic faults such as $dRDF^n$ because of the addition of the same write operation after the first write operation in the testing steps for sequentially reading and writing storage units and the execution of at least three consecutive read operations on the first written information.

The structure of the reconfigurable MBIST circuit disclosed by the present disclosure is as follows. The overall circuit is composed of a MBIST generating module and an adaptive control module. The adaptive control module internally includes an adaptive controller and an instruction register. The characteristics of the circuit lie in that the adaptive controller generates the algorithm element selection signals switch_alg according to the comparison results between the external input environment parameters and the fault model library, as well as the user-defined instructions. The instruction register obtains the signals R_times for setting the value for n according to the user-defined instructions. The signals R_times are used to control the reconfigurable algorithm state machine inside the MBIST generating module, so that the most appropriate algorithm elements in the current environment can be selected adaptively according to the external environment at the circuit level, achieving the highest test efficiency. The algorithm element selection signals switch_alg and R_times can be further generated according to the March algorithm that is selected by user-defined.

The signals R_times are used to define the number of skips "n" of the read and write functions of the internal reconfigurable algorithm state machine. The users directly control the number of read and write operations of the internal Hammer algorithm testing elements, such that the requirements for targeted detections on dynamic read interference faults in special conditions can be satisfied, without affecting the running time of the overall algorithm under general testing conditions. This is because considering that the detections on the dynamic read interference faults frequently requires multiple consecutive read and write operations for the storage units, which is not applicable to the detections on the other faults and can also double the overall testing time. Therefore, the self-test method built in the reconfigurable memory that is provided by the present disclosure provides the operations of user-defined setting of the number of the read and write operations in the algorithm elements to satisfy the expectations of the testing time costs.

The MBIST generating module includes the reconfigurable algorithm state machine, a data generator, an address generator, a control generator, a comparator and a diagnoser. When the MBIST generating module executes the March Adapt-RAWC1 algorithm, the reconfigurable algorithm state machine receives the algorithm element selection signals and the instructions to set the value for n in the Hammer testing algorithm elements, selects the signals switch_alg and the instructions R_times to set the value for n in the Hammer testing algorithm elements according to the algorithm elements, executes the classic March C+ testing algorithm, or the classic March RAW testing algorithm, or the March RAW testing algorithm that integrates the Hammer nR testing algorithm elements. The data generator generates the testing data generated for the storage units during an execution of the testing algorithm by the reconfigurable algorithm state machine. The address generator generates addresses of the storage units tested during the execution of the testing algorithm by the reconfigurable algorithm state machine. The control generator generates enable signals for executing read and write operations on the storage units during the execution of the testing algorithm by the reconfigurable algorithm state machine. The comparator reads the actual output data of the current storage unit after executing the testing algorithm, and the testing data generated for the current storage unit during the execution of the testing algorithm by the reconfigurable algorithm state machine; and when deviations are generated between the actual output data of the current storage unit after executing the testing algorithm and the testing data generated for the current storage unit during the execution of the testing algorithm by the reconfigurable algorithm state machine, the prompt signal of detecting the faults of the current storage unit is output. The diagnoser reads the address of the current storage unit that executes the testing algorithm, when receives the prompt signal of detecting the faults of the current storage unit, the address of the current storage unit is output.

The time complexities of the March Adapt-RAWC can be calculated according to the specific descriptions of the above-mentioned algorithms. When merely the bold algorithm elements are run, the complexity is merely 14N. When all the elements are run, the complexities of the March Adapt-RAWC1 and the March Adapt-RAWC2 are respectively 24N+2nN (0<n<10) and 40N+2nN (0<n<9), where N is the number of all units in the storage arrays.

Regarding the reconfigurable algorithm state machine, the state machine of the March Adapt-RAWC1 algorithm disclosed by the present disclosure is taken as an example. The state machine is composed of 20 states which include the initial state IDLE, the end state DONE, and 18 read and write states, and the skipping rules of these 18 states are controlled by the adaptive controller and the instruction register in the logic circuits. The adaptive controller reflects the current environmental information, including the PVT parameters, then compares the obtained environmental parameters with the fault model library, and automatically adjusts algorithm element state machines by outputting the corresponding control signals switch_alg and R_times, that is, forms the adaptive algorithms. The adjustability of the state machines is reflected in the circuits where different algorithms share the same MBIST circuit. Different algorithm paths are reconfigured in different environmental parameters by the MBIST, that is the reconfigurabilities of the MBIST algorithm circuits are completed.

By adopting the above-mentioned technical solutions, the present disclosure has the following beneficial effects.

(1) The adaptive March algorithm provided by the present disclosure, that is, Adapt-RAWC can automatically reconfigure the different algorithms to satisfy different requirements for detections according to the external environment or the user instructions, which dynamically adjusts the time complexities and the fault coverage rates by adaptively switching the algorithm elements, such that an excellent balance is to achieved. In addition, the algorithm has relatively high fault coverage rates, reaching 100% for the listed static faults and can detect dynamic faults such as $dRDF'''$ and $dCFdsww$ that cannot be detected by the classic March RAW algorithm, and the dynamic fault coverage rates are increased by 31.3%.

(2) The reconfigurable MBIST circuit provided by the present disclosure is implemented based on a state machine whose algorithm elements are configurable. The state machine is controlled by the control signals generated by the external environmental parameters or the user-defined instructions, the most suitable algorithm elements in the current environment can be adaptively selected according to the external environment, resulting in the highest testing efficiency. Another advantage is that different built-in algorithms share the majority of the circuit components in a state machine circuit, which saves 58% of the circuit areas compared with the circuits that are equipped with the same algorithm function.

BRIEF DESCRIPTION OF THE DRAWINGS

In order to enable the technical solutions of the embodiments of the present disclosure to be clarified more clearly, a brief introduction will be given to the accompanying drawings required in the descriptions of the embodiments. Obviously, the accompanying drawings in the following descriptions are merely a part of embodiments of the present disclosure. For an ordinary person skilled in the art, other accompanying drawings can be derived based on these accompanying drawings without making creative efforts.

DESCRIPTION OF THE EMBODIMENTS

In order to enable the above-mentioned objectives, features and advantages of the present disclosure to be more apparent and understandable, detailed specifications are provided below to the specific implementation methods of the present disclosure in conjunction with the accompanying drawings of the specification. Obviously, the embodiments described are merely a part of the embodiments of the present disclosure, rather than all of the embodiments in the present disclosure. Based on the embodiments of the present disclosure, all other embodiments, which are derived by an ordinary person skilled in the art without making creative efforts, shall fall within the protection scope of the present disclosure.

Adaptive March Algorithm

Figure 1:
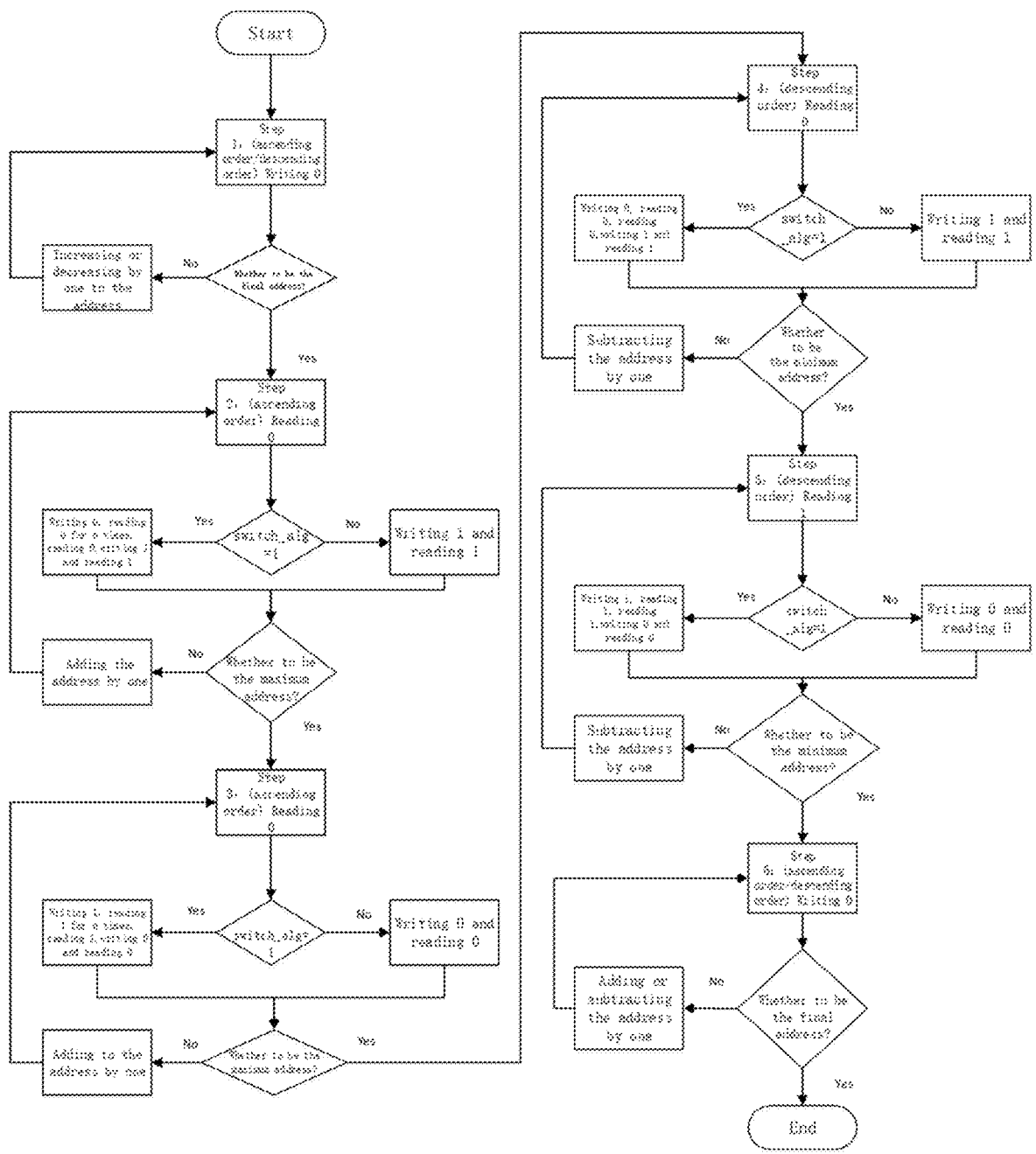
FIG. 1 illustrates an execution flowchart diagram of a March Adapt-RAWC1 algorithm.

The provided adaptive March algorithm, that is, March Adapt-RAWC includes two algorithms of March Adapt-RAWC1 and March Adapt-RAWC2. By taking the March Adapt-RAWC1 as an example, the flowchart diagram of the March Adapt-RAWC1 algorithm is as illustrated in FIG. 1, and includes the following steps.

In Step 1, testing steps M1: $\updownarrow(w0)$ are executed, operations for writing 0 are executed to all storage units according to an ascending order or a descending order of any address to determine whether the current address is the final address. If the current address is not the final address, the address is added or subtracted by one, and the operations for writing 0 are repeated. When the operations for writing 0 at the final address are completed, the test is skipped to the subsequent algorithm element.

In Step 2, testing steps M2: $\downarrow(r0,w0,r0'',r0,w1,r1)$ are executed, the operations for writing 0 are firstly executed to the addresses of the storage units according to the ascending order of the address to determine whether the signals switch_alg are 1. If the signals are 1, the following operations for writing 0, reading 0 n times (the default value for n is 1), reading 0, writing 1, and reading 1 are executed in sequence. If the signals switch_alg are 0, the operations for writing 1 and reading 1 are executed in sequence, and then whether the current address is the highest address is determined. If the current address is not the highest address, the address is added by one and the operation elements in Step 2 of the above-mentioned algorithm are repeated. When the current address is determined to be the highest address, the test is skipped to Step 3 of the algorithm.

In Step 3, testing steps M3: $\uparrow(r1,w1,r1'',r1,w0,r0)$ are executed, the operation for reading 1 are firstly executed to the addresses of the storage units according to the ascending order of the address to determine whether the signals switch_alg are 1. If the signals switch_alg are 1, the following operations for writing 1, reading 1 n times (the default value for n is 1), reading 1, writing 0, and reading 0 are executed in sequence. If the signals switch_alg are 0, the operations for writing 0 and reading are executed in sequence, and then whether the current address is the highest address is determined. If the current address is not the highest address, the address are added by one and the operation elements in Step 3 of the above-mentioned algorithm are repeated. When the current address is determined to be the highest address, the test is skipped to Step 4 of the algorithm.

In Step 4, testing steps M4: $\Downarrow$(r0,w0,r0,r0,w1,r1) are executed, the operations for reading 0 are firstly executed to the addresses of the storage units according to the descending order of the address to determine whether the signals switch_alg are 1. If the signals switch_alg are 1, the following operations for writing 0, reading 0, reading 0, writing 1, and reading 1 are executed in sequence. If the signals switch_alg are 0, the operations for writing 1 and reading 1 are executed in sequence, and then whether the current address is the lowest address is determined. If the current address is not the lowest address, the address is subtracted by one and the operation elements in Step 4 of the above-mentioned algorithm are repeated. When the current address is determined to be the lowest address, the test is skipped to Step 5 of the algorithm.

In Step 5, testing steps M5: $\Downarrow$(r1,w1,r1,r1,w0,r0) are executed, the operations for reading 1 are firstly executed to the addresses of the storage units according to the descending order of the address to determine whether the signals switch_alg are 1. If the signals switch_alg are 1, the following operations for writing 1, reading 1, reading 1, writing 0, and reading 0 are executed in sequence. If the signals switch_alg are 0, the operations for writing 0 and reading 0 are executed in sequence, and then whether the current address is the lowest address is determined. If the current address is not the lowest address, the address is subtracted by one and the operation elements in Step 5 of the above-mentioned algorithm are repeated. When the current address is determined to be the lowest address, the test is skipped to Step 6 of the algorithm.

In Step 6, testing steps M6: $\Updownarrow$(r0) are executed, the operations for reading 0 are executed to all storage units according to the ascending order or the descending order of an arbitrary address. When the operations for reading 0 of the final address are completed, the testing is terminated.

The data (actual data) that are read out from the data output terminal of the memory are compared with data (expected data) that are previously stored in the memory at the current address by the comparator in the read operations. If deviations are generated between the two kind of data, the signal Test_Fail is pulled up to indicate that a fault is detected, the current fault is diagnosed, and the fault address is output by the Fail_ADR.

The structure of the disclosed March Adapt-RAWC2 algorithm is similar with the execution steps of the March Adapt-RAWC1 algorithm, which will not be further elaborated herein.

Figure 2:
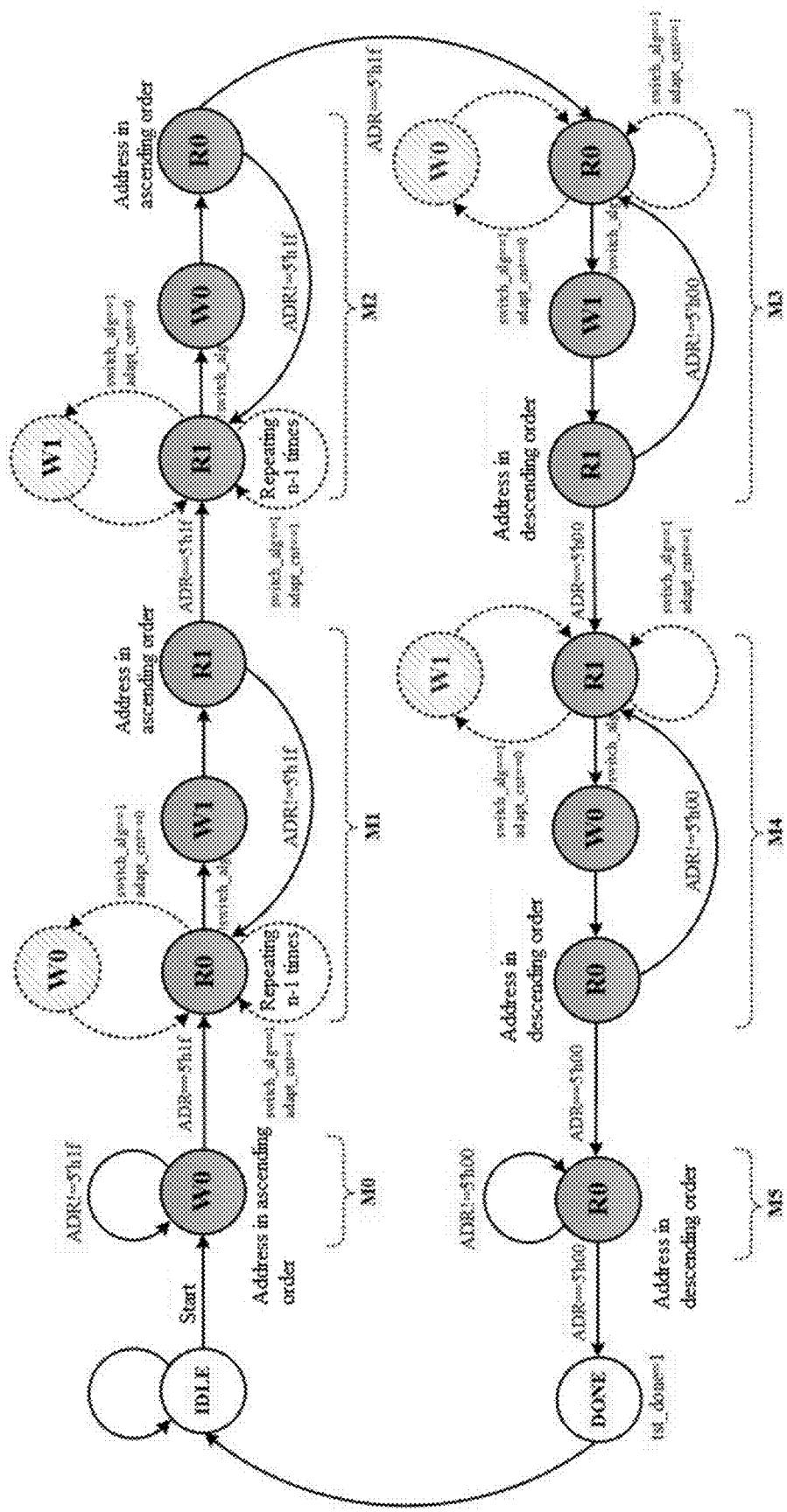
FIG. 2 illustrates a state transition diagram of the March Adapt-RAWC1 algorithm.

The functions of the March Adapt-RAWC algorithm are implemented based on the finite-state machines. Further by taking the March Adapt-RAW1 as an example, the state transition diagram is as illustrated in FIG. 2. The initial state of the algorithm is the IDLE state, and the MBIST circuit will cycle and wait for the instructions under this state before and after the MBIST circuit runs, the end state is the DONE state, which represents the state after executing all elements of the adaptive algorithm and the testing end signal tst_done and testing result signal Test_Fail are output under this state. If the output Test_Fail is 1, it indicates that there are faults in the tested memory and diagnoses are performed simultaneously to output the address Fail_ADR where the faults are located, if the Test_Fail is 0, it indicates that no faults are detected in the memory. The remaining state elements in the gray solid line blocks and the state elements marked in the dashed line blocks with shaded background in FIG. 2 all represent read or write operations on the memory. M0: $\Updownarrow$(w0) represents that the operations for writing 0 are executed to the memory according to the ascending order or the descending order (the present algorithm selects the ascending order in the simulation). After each time of operations for writing 0 is executed, the address is added by one. When the operation for writing 0 is executed at the final address, the operations {r0w1r1} or {r0w0r0"r0w1r1} of M1 are executed. Every time the last operation of the algorithm element is performed, a determination is made to determine whether the current address is the final address. If the current address is the final address, the algorithm is skipped to the subsequent state, if the current address is not the final address, the operations of adding or subtracting by one to the address are executed on the address, and then the algorithm is skipped back to the first operation of the algorithm element, and so on. The "repeat n−1 times" under the R0 operation of the algorithm elements M1 and M2 in FIG. 2 means that by default, one read operation is performed after w0 and w1, and the number of times to repeat the operations for reading 0 and 1 is automatically subtracted by 1 based on the set signal value R_Times. The adapt_CNT represents the counting number for repeating to read 0 or 1 by counting from 1 until the repeating number is n-i. The key and uniqueness of executing the adaptive algorithms lie in selecting algorithm elements according to the external PVT environmental parameters, and different selection results result in executing different testing algorithms, varying coverage capabilities of faults, and ultimately varying testing time. Specifically, it can be seen from FIG. 2 that the read and write operations are respectively represented by the elements in solid line blocks with gray background and the elements in dashed line blocks with shaded background. The directions of state skipping are distinguished by the solid line arrows and the dashed line arrows. The operation states of the solid line blocks with a gray background can be selected, and the arrow on this element points to another algorithm path. It can be seen that no matter the algorithm paths pointed by the solid line arrows or the algorithm paths pointed by the dashed line arrows all contain common state elements, which is also the characteristics that the MBIST circuit provided by the present disclosure shares the majority of the circuit elements to implement two types of the algorithms, while if the traditional MBIST circuit wants to implement the functions of multiple algorithms, and multiple algorithmic state machines must be designed, which wastes redundant circuit areas.

Reconfigurable MBIST Circuit

Figure 3:
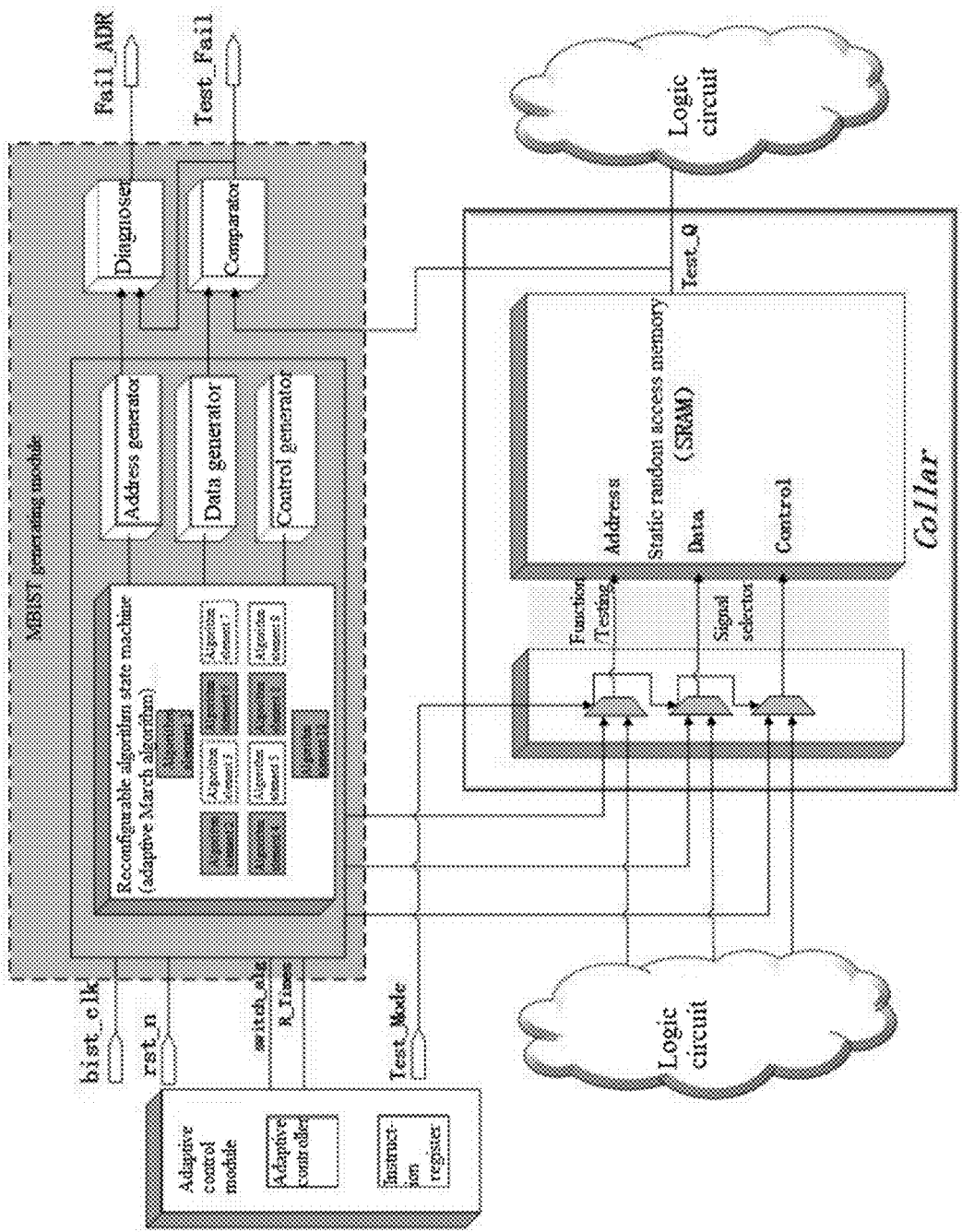
FIG. 3 illustrates a structural diagram of a reconfigurable MBIST circuit.

The structure of the reconfigurable MBIST circuit disclosed by the present disclosure is as illustrated in FIG. 3. The overall circuit is composed of the MBIST generating module and the adaptive controller. The main circuit body is the MBIST generating module, which is composed of the reconfigurable algorithm state machine, the data generator, the address generator, the control generator, the comparator and the diagnoser. The SRAM Collar is composed of the function/testing signal selector and the SRAM. The function/testing signal selector is mainly configured to switch the current operation modes of the SRAM, when the Test_Mode is at the high power level, the SRAM enters the testing mode. The addresses, data, chip selections, and signals such as write enable signals of the SRAM are provided by the MBIST generating module. When Test_Mode is lowered, the SRAM enters the functional mode, and the addresses, data, chip selections, and signals such as write enable signals of the SRAM are provided by the logic circuit.

The address generator and data generator in the MBIST generating module are configured to generate the tested storage unit addresses and testing data during the executions for reconfiguring the algorithm by the state machine. The control generator module is configured to generate read and write enable signals of the SRAM. When the SRAM receives the read and write enable signals, it executes read and write operations according to the addresses that are generated by the address generator and the testing data that are generated by the data generator, and the clock signals of the SRAM is synchronized with that of the MBIST. The data generator, the address generator, and the control generator in the MBIST generating module are all controlled by the reconfigurable algorithm state machine. The state machine is composed of 20 states, including the initial state IDLE, the end state DONE, and 18 read and write states. The skipping rules of these 18 states are controlled by the algorithm element selection signals switch_alg that are output by the adaptive controller in the adaptive control module. The adaptive controller reflects the current environmental information, including the PVT parameters, and then compares the obtained environmental parameters with the fault model library, automatically adjusts the algorithm element state machine by outputting the control signals corresponding to the algorithm element selection signals switch_alg, that is, forms an adaptive algorithm. The adjustability of the state machine is reflected in the circuits where different algorithms share the same MBIST circuit. Different algorithm paths are reconfigured under different environmental parameters by the MBIST, that is, the reconfiguration of the MBIST algorithm circuit is competed. Read and write signals are generated by using the most suitable algorithm to detect the faults that are most prone to appear at present, which has higher efficiencies. When the control generator outputs the read enable signals, the comparator compares the data read from the SRAM storage units with the expected testing data. If the read data do not match with the expected testing data, the signals Test_Fail are pulled up to alert the user that there are faults in the SRAM. The diagnoser is configured to read the addresses of the tested SRAM in real-time during the testing process, and output the address of the current SRAM by the Fail_ADR when the comparator outputs the Test_Fail of the faults in the current SRAM.

As illustrated in FIG. 3, the adaptive algorithm in the reconfigurable algorithm state machine is composed of 10 algorithm elements, and the serial numbers of the different algorithm elements represent the initial execution order. The algorithm element 1: $\uparrow\downarrow(w0)$, the algorithm element 2: $\uparrow(r0,w1,r1)$, the algorithm element 4: $\uparrow(r1,w0,r0)$, the algorithm element 6: $\downarrow(r0,w1,r1)$, the algorithm element 8: $\downarrow(r1,w0,r0)$, and the algorithm elements 10: $\uparrow\downarrow(r0)$ are the shared algorithm elements, which are shared by different reconfigured testing algorithms. The algorithm element 3: $\uparrow(w0,w0,r0^n,r0,r0,w0,r0)$, the algorithm element 5: $\uparrow(w1, w1,r1^n,r1,r1,w1,r1)$, the algorithm element 7: $\downarrow(w0,w0,r0, r0,r0,w0,r0)$, and the algorithm element 9: $\downarrow(w1,w1,r1,r1, r1,w1,r1)$ are optional algorithm elements, which are configured to form the testing algorithms with relatively high complexities.

Derivation of Fault Coverage Rate of Adaptive March Algorithm

TABLE 1

Specific descriptions and time complexities of the common March algorithm and the adaptive March algorithm

| Testing algorithm | Algorithm description | Time complexity |
|---|---|---|
| MATS++ | $\{\uparrow\downarrow(w0); \uparrow\downarrow(r0, w1); \uparrow\downarrow(r1, w0, r0)\}$ | 6N |
| March C− | $\{\uparrow\downarrow(w0); \uparrow(r0, w1); \uparrow(r1, w0); \downarrow(r0, w1);$ $\downarrow(r1, w0); \uparrow\downarrow(r0)\}$ | 10N |
| March C+ | $\{\uparrow\downarrow(w0); \uparrow(r0, w1, r1); \uparrow(r1, w0, r0);$ $\downarrow(r0, w1, r1); \downarrow(r1, w0, r0); \uparrow\downarrow(r0)\}$ | 14N |
| March AB | $\{\uparrow\downarrow(w1); \downarrow(r1, w0, r0, w0, r0);$ $\downarrow(r0, w1, r1, w1, r1);$ $\uparrow(r1, w0, r0, w0, r0);$ $\uparrow(r0, w1, r1, w1, r1); \uparrow(r0)\}$ | 14N |
| March RAW | $\{\uparrow\downarrow(w0); \uparrow(r0, w0, r0, r0, w1, r1);$ $\uparrow(r1, w1, r1, r1, w0, r0);$ $\downarrow(r0, w0, r0, r0, w1, r1);$ $\downarrow(r1, w1, r1, r1, w0, r0); \uparrow\downarrow(r0)\}$ | 26N |
| March Adapt-RAWC1 | $\{\uparrow\downarrow(\mathbf{w0}); \uparrow(\mathbf{r0}, w0, r0^n, r0, \mathbf{w1}, \mathbf{r1});$ $\uparrow(\mathbf{r1}, w1, r1^n, r1, \mathbf{w0}, \mathbf{r0});$ $\downarrow(\mathbf{r0}, w0, r0, r0, \mathbf{w1}, \mathbf{r1});$ $\downarrow(\mathbf{r1}, w1, r1, r1, \mathbf{w0}, \mathbf{r0}); \uparrow\downarrow(\mathbf{r0})\}$ | 14N/ (24N + 2 nN), 0 < n < 10 |
| March Adapt-RAWC2 | $\{\uparrow\downarrow(\mathbf{w0}); \uparrow(\mathbf{r0}, w0, w0, r0^n, r0, r0, w0, r0, \mathbf{w1}, \mathbf{r1});$ $\uparrow(\mathbf{r1}, w1, w1, r1^n, r1, r1, w1, r1, \mathbf{w0}, \mathbf{r0});$ $\downarrow(\mathbf{r0}, w0, w0, r0, r0, w0, r0, \mathbf{w1}, \mathbf{r1});$ $\downarrow(\mathbf{r1}, w1, w1, r1, r1, r1, w1, r1, \mathbf{w0}, \mathbf{r0}); \uparrow\downarrow(\mathbf{r0})\}$ | 14N/ (40N + 2 nN), 0 < n < 9 |

Table 1 lists the specific descriptions and the time complexities of the common March algorithm and the adaptive March algorithm disclosed by the present disclosure. The present disclosure provides the March Adapt-RAWC1 and the March Adapt-RAWC2 that all include the functions of switching the adaptive algorithms according to different requirements, whose complexities and fault coverage rates are increased in turn. Hammer testing elements are added to the March Adapt-RAWC1 based on the March RAW, which has excellent detections on the dRDF" faults. n is the time number of consecutively executing read operations to the address of the same storage unit, and the value for this time number is controlled by the pin R_Times of the adaptive control module, and can be configured according to requirements of the users. The March Adapt-RAWC2 is an enhanced version for the fault coverage rates of the adaptive March algorithm. The calculations of the fault coverage rates and the circuit simulations mentioned in the description are based on the March Adapt-RAWC2 by default. March Adapt-RAWC1 is used to display the state diagrams and the algorithm flowcharts diagrams due to its relatively less states.

In Table 1, the bold parts of the specific descriptions of the provided March Adapt-RAWC algorithm are the March C+ algorithm elements, and the remaining elements are optional. When the set value for n is greater than 1, the Hammer nR testing algorithm ("nR" represents executing read operations n times) is composed of the element r0$^n$ alone. When all bold and all non-bold elements are selected, and n is set to 1, the March Adapt-RAWC1 and the classic March RAW testing algorithm are the same. The non-bold algorithm elements are selected through the skipping of the state machine, and the number of repeating read and write operations in the Hammer testing algorithm elements is controlled by using the signals R_Times in the adaptive control module. When the value for R_Times is the default value 1, the Hammer testing algorithm elements with multiple read operations are not run. When the value for R_Times is n, the additional read operations are repeated for n−1 times. According to the specific descriptions of the algorithm in Table 1, the time complexities can be calculated. When the bold algorithm elements are merely run, the complexity is 14N. When all the elements are run, the complexities of the March Adapt-RAWC1 and the March Adapt-RAWC2 are 24N+2nN (0<n<10) and 40N+2nN (0<n<9), respectively. The March Adapt-RAWC2 provided by the present disclosure adds read and write steps based on the testing elements of the March RAW. For example, M1 adds w0 and r0$^n$ operations at the rear of the first w0 operation, and then adds w0 and r0 operations at the front of the w1 operation, and the subsequent M2, M3, and M4 are similar with that. The testing elements of the provided adaptive algorithm have symmetry. For example, the algorithm elements corresponding to M1 are the same as those of M3, the algorithm elements corresponding to M2 are the same as those of M4, but the order of execution addresses is different. The implementation of the symmetry is to detect coupling fault types more comprehensively. Since the coupling faults include faults more than in one storage unit, but rather multiple faults of the storage unit due to the mutual interferences between the storage units. The storage units at the high address may have impacts on the storage units at the low address, and vice versa. Therefore, two different execution orders, that is, the ascending order and the descending order are required by the same algorithm elements to detect the faults of the storage unit more comprehensively.

Detection on Static Fault by Adaptive March Algorithm

In order to facilitate the readers to understand the derivation processes of fault coverage rates of the adaptive March algorithm, this embodiment briefly introduces the concepts of the fault primitives. The fault primitives (FP) represent the deviations between the expected (faultless) storage behaviors and the observed (faulty) storage behaviors under a set of executed operations that are represented as FP=<S/FB>. S represents the sensitization operations that are exerted to the storage units, and FB represents the erroneous behaviors that are sensitized by S. The fault primitives of the coupling faults separate the affecting units at the left side and the affected units at the right side by commas. The affected units are the storage units where faults appear, the affecting unit are the storage units where induce fault behaviors of the affected units. The Functional memory fault model (FFM) is composed of a set of non empty FPs.

TABLE 2

Static fault coverage rates of different March algorithms

| Faults model | March algorithm | | | | | |
|---|---|---|---|---|---|---|
| | MATS++ | March C− | March C+ | March AB | March RAW | March Adapt-RAWC |
| SF | 2/2 | 2/2 | 2/2 | 2/2 | 2/2 | 2/2 |
| TF | 1/2 | 2/2 | 2/2 | 2/2 | 2/2 | 2/2 |
| WDF | 0/2 | 0/2 | 0/2 | 2/2 | 2/2 | 2/2 |
| RDF | 2/2 | 2/2 | 2/2 | 2/2 | 2/2 | 2/2 |
| DRDF | 0/2 | 0/2 | 2/2 | 2/2 | 2/2 | 2/2 |
| IRF | 2/2 | 2/2 | 2/2 | 2/2 | 2/2 | 2/2 |
| CFst | 4/8 | 8/8 | 8/8 | 8/8 | 8/8 | 8/8 |
| CFdsrx | 3/8 | 8/8 | 8/8 | 8/8 | 8/8 | 8/8 |
| CFdssw!x | 3/8 | 8/8 | 8/8 | 8/8 | 8/8 | 8/8 |
| CFsxwx | 0/8 | 0/8 | 0/8 | 8/8 | 8/8 | 8/8 |
| CFtr | 2/8 | 8/8 | 8/8 | 8/8 | 8/8 | 8/8 |
| CFwd | 0/8 | 0/8 | 0/8 | 8/8 | 8/8 | 8/8 |
| CFrd | 4/8 | 8/8 | 8/8 | 8/8 | 8/8 | 8/8 |
| CFdrd | 0/8 | 0/8 | 8/8 | 8/8 | 8/8 | 8/8 |
| CFir | 4/8 | 8/8 | 8/8 | 8/8 | 8/8 | 8/8 |
| Total | 27/84 | 56/84 | 66/84 | 84/84 | 84/84 | 84/84 |
| Fault coverage rate | 32.14% | 66.67% | 78.57% | 100% | 100% | 100% |

Through the derivations for the fault primitives, it can be found that the detections on the static faults by the March C+ algorithm cannot cover the faults such as WDF, CFsxwx, and CFwd, which can be well detected by the March RAW algorithm and the improved March Adapt-RAWC algorithm provided by the present disclosure. This conclusion is verified by using the fault primitives. The fault primitives of WDF are: <0w0/↑/→, <1w1/↓/→. The sensitization operations are to write a value that is the same as that stored in the current storage unit, while the March C+ algorithm does not equipped with this sensitization operations. CFsxwx is coupling faults in the write interference states, and CFwd is coupling faults in the write damages, both of which are similar with the WDF and need to write a value that is the same as the current state, while the March C+ algorithm lacks relevant read and write elements, thus this type of faults cannot be detected. By the derivations for the fault primitives, the detection situations on different algorithms for other types of the static faults are as specifically shown in Table 2.

Detection on Dynamic Fault by Adaptive March Algorithm

For the dynamic faults such as dDRDF, dWDF, dCFdsww, dCFdrd and dCFwd, compared with the March RAW, the March Adapt-RAWC algorithm provided by the present disclosure is capable of covering these types of the faults more comprehensively. A dynamic fault coverage rate reaches to 80.9%, which increases by 31.3% compared with the March RAW. By taking the dDRDF faults as an example, the fault primitives of this fault are: <xWyRy/~y/~y>, <xRxRx/~x/x>, where the values for x and y are 0 and 1. It can be known by the fault primitives that in order to sensitize this type of the faults, a read operation must be executed immediately after a write operation or a read operation. The read data are opposite to the actual values at this time, and the actual values are changed, thus, an additional read operation is required. For the four cases of <xWyRy/~y/~y>, the March RAW can cover them well, but the two cases of <xRxRx/~x/x>, although the M1, M2, M3 and M4 of the March RAW have two consecutive read operations, they still lack one read operation, which results that this type of the faults can not be detected. The algorithms M1, M2, M3 and M4 provided by the present disclosure all have at least three consecutive read operations, thus being capable of effectively detecting this type of faults.

As a subclass of the dynamic disturb coupling faults (dCFds), the fault primitives of the dCFdsww have 16 cases, and the sensitization operations are to execute a write operation immediately after the write operations. The corresponding fault primitives are <xWxWt,z/~z/→>, where the values for x, t, and z are 0 and 1. It can be seen from the fault primitives that in order to sensitize this type of the faults to invert the stored values of the affected units, two consecutive write operations must be executed to the affecting units, and the value for the previous write must be the same as the value for the current state.

Figure 4:
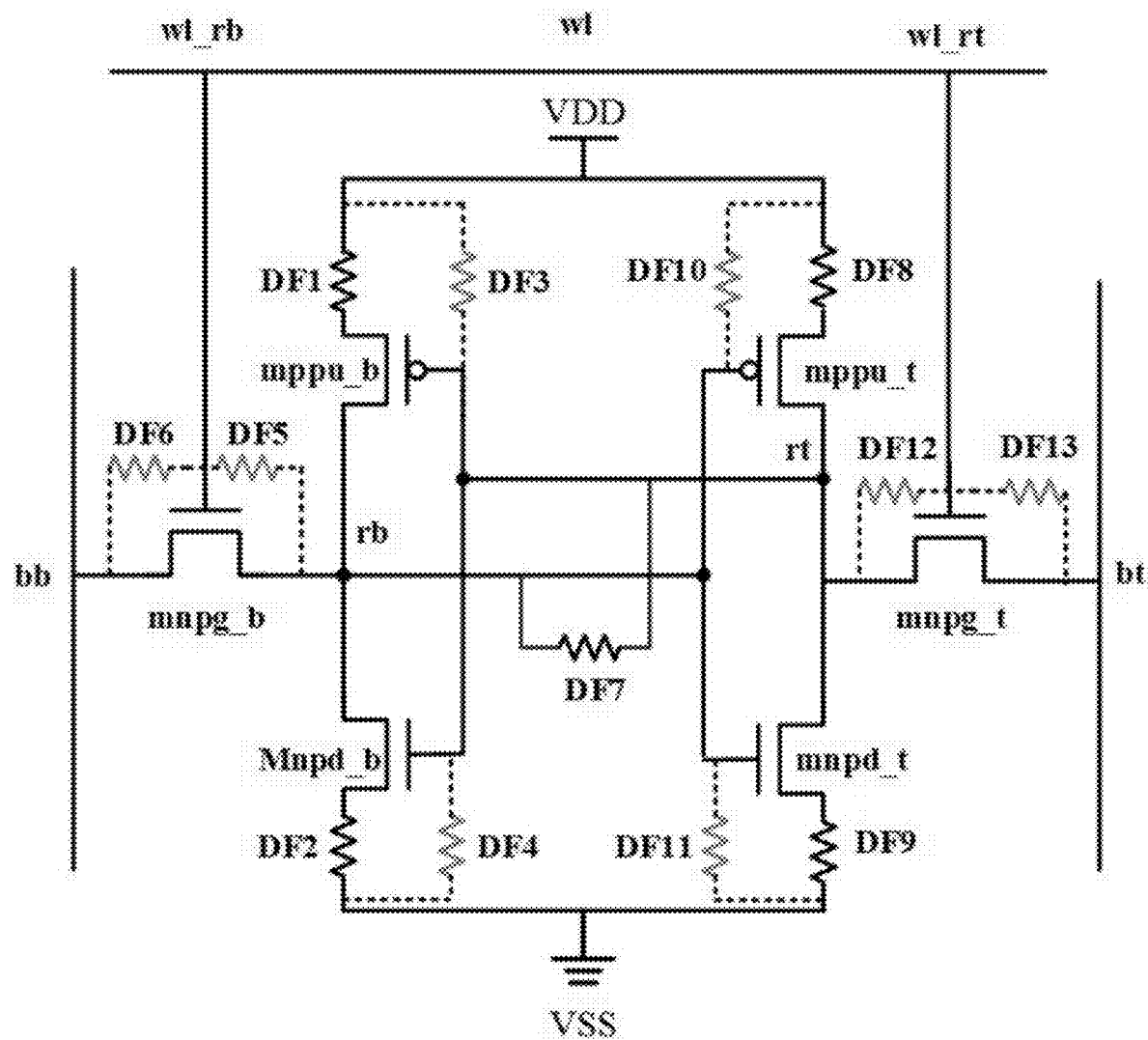
FIG. 4 illustrates a schematic diagram of the fault injection positions.

The other algorithms listed in Table 1 neither satisfy the sensitization conditions nor contain consecutive write operations or the first write value is not the same as the current value. The provided March Adapt-RAWC algorithm adds the same write operations after the first write operations in M1 and M2, an then a read operation are followed closely, such that the faults can be detected. M3 and M4 have symmetry, thus the entire algorithm can cover the coupling types in both the ascending order and the descending order to a certain extent. The algorithm coverage situations on other faults are as specifically shown in Table 3.

and temperatures. The resistances inserted between the lines is the short-circuit resistance, and the resistances inserted between the two nodes is called as the short-circuit resistance, which are as illustrated in FIG. 4. The specific operation method is to change the descriptions of the standard units in the net list cdl of the SRAM, to describe the inserted positions of the faults and the values for the resistances of the faults by using spice language, to adjust the PVT parameters, and to repeat the experiments for multiple times. The software FineSim is used to observe memory circuit nodes and the output simulation waveforms.

The relevant simulation results of the fault injections are summarized in Table 4. The table lists the fault injection locations and corresponding fault models of different transistor nodes. The arabic numbers in the names of the fault models are used to represent the number of executing consecutive read operations in the storage units at the same address. The experimental researches on the fault injections provide supports to the subsequent simulation verifications.

TABLE 3

Dynamic fault coverage rates for different March algorithms

| | March algorithm | | | | | |
|---|---|---|---|---|---|---|
| Faults model | MATS++ | March C− | March C+ | March AB | March RAW | March Adapt-RAWC |
| dRDF | 0/6 | 0/6 | 2/6 | 4/6 | 6/6 | 6/6 |
| dRDF$^n$ < n ≤ 10) | 0/6n | 0/6n | 0/6n | 0/6n | 0/6n | 6n/6n |
| dIRF | 0/6 | 0/6 | 2/6 | 4/6 | 6/6 | 6/6 |
| dDRDF | 0/6 | 0/6 | 2/6 | 4/6 | 4/6 | 6/6 |
| dTF | 1/6 | 2/6 | 2/6 | 2/6 | 2/6 | 2/6 |
| dWDF | 0/6 | 0/6 | 2/6 | 2/6 | 2/6 | 4/6 |
| dCFdswr | 0/16 | 0/16 | 8/16 | 16/16 | 16/16 | 16/16 |
| dCFdsww | 0/32 | 0/32 | 0/32 | 0/32 | 0/32 | 8/32 |
| dCFdsrw | 3/16 | 8/16 | 8/16 | 16/16 | 16/16 | 16/16 |
| dCdsrr | 0/8 | 0/8 | 0/8 | 0/8 | 8/8 | 8/8 |
| dCFrd | 0/24 | 0/24 | 8/24 | 16/24 | 24/24 | 24/24 |
| dCFir | 0/24 | 0/24 | 8/24 | 16/24 | 24/24 | 24/24 |
| dCFdrd | 0/24 | 0/24 | 8/24 | 16/24 | 16/24 | 24/24 |
| dCFtr | 2/24 | 8/24 | 8/24 | 8/24 | 8/24 | 8/24 |
| dCFwd | 0/24 | 0/24 | 0/24 | 8/24 | 8/24 | 16/24 |
| Total | 6/282 | 18/282 | 58/282 | 112/282 | 140/282 | 228/282 |
| Fault coverage rate | 2.1% | 6.4% | 20.6% | 39.7% | 49.6% | 80.9% |

4. Verification on Beneficial Effects of Present Disclosure a) Fault Injection

The fault injection is a technique in the field of memory testing that analyzes and simulates the exhibited fault behaviors when there are faults in the memory chips, and verifies the effectiveness of the testing algorithms. The functional fault models are injected to simulate actual physical defects, and then the deviations of the results caused by different defects are recorded to calculate and validate the fault coverage rates of the algorithms.

In the present disclosure, the application objects of the fault injection technology is the interconnection nodes between the SRAM single bit storage unit transistors. The application method is to inject resistances between the above-mentioned nodes and lines under different voltages

TABLE 4

Statistics for results of fault injections

| Fault injection position | Fault model (Voltage:1.2 V~0.8 V; Temperature: 125° C. 25° C.) |
|---|---|
| DF1 | DRDF/dDRDF/DRF/dRDF$^7$/dRDF$^5$/dRDF$^3$ |
| DF2 | DRDF/RDF/dDRDF/dRDF$^2$/dRDF$^4$/dRDF$^8$ |
| DF3 | SAF1/dRDF/dRDF$^2$ |
| DF4 | SAF0/dRDF$^2$ |
| DF5 | dIRF/dRDF/dDRDF |
| DF6 | dCFrd/CFrd/ |
| DF7 | CFds/dCFds/dCFds$^2$ | b) Verifications on Digital-Analog Mixed Simulation

Figure 5:
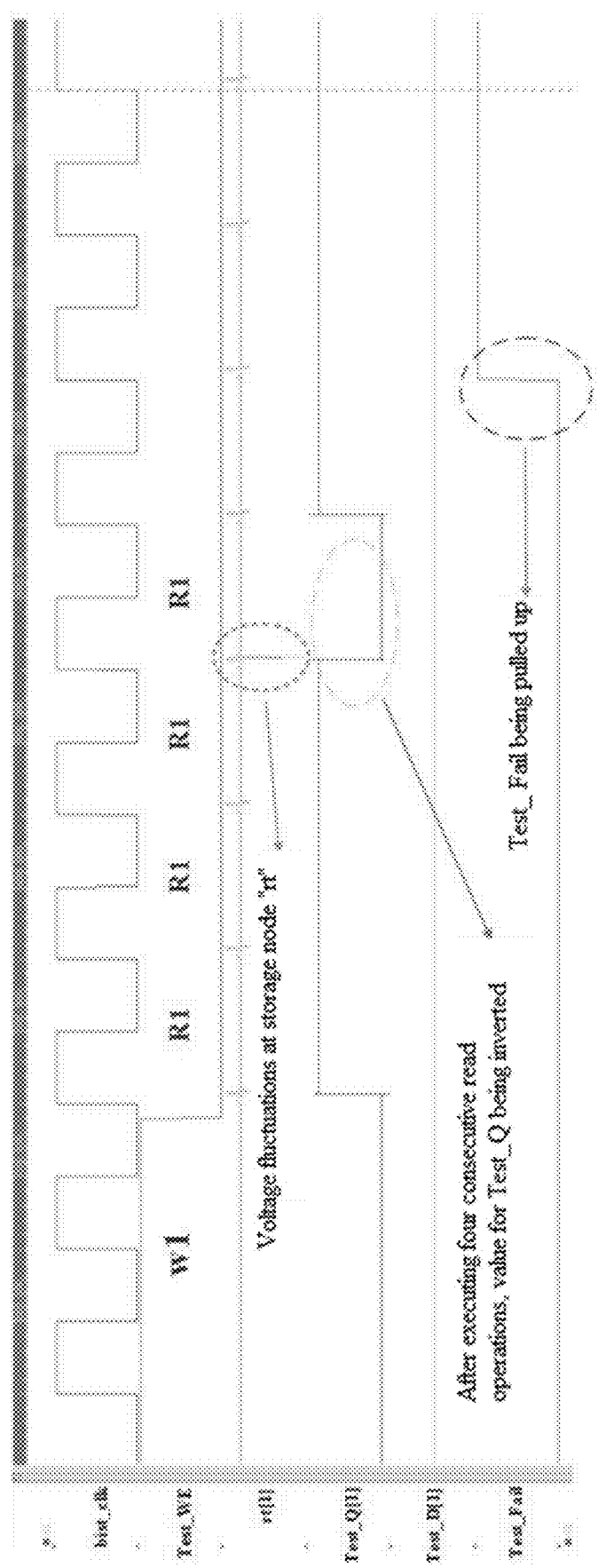
FIG. 5 illustrates a local waveform diagram of a mixed digital and analog simulation on $dRDF^4$ faults.

The experimental environment for this digital-analog mixed simulation is VCS+FineSim. By taking the simulations on the faults dRDF$^4$ as an example, the local waveform diagram of the digital-analog mixed simulation is as illustrated in FIG. 5. The dRDF$^4$ is the case of the dRDF$''$ when n=4, which belongs to a type of the dynamic read interference faults, that is, four consecutive read operations are executed immediately after a write operation is executed to one unit at the same address, and then the value for the storage value nodes of this unit is inverted, such that the erroneous logical value is read out. In this simulation, the faults are injected into the storage address of addr[1], which causes voltage fluctuations at the storage node "rt". The erroneous logical values are consecutively read out by using the provided adaptive March algorithm, the signals Test_Fail are pulled up, indicating that the faults are detected, while the compared algorithms such as March C+ and March RAW do not equipped with four consecutive read operations, and therefore, this type of the faults cannot be sensitized.

Figure 6:
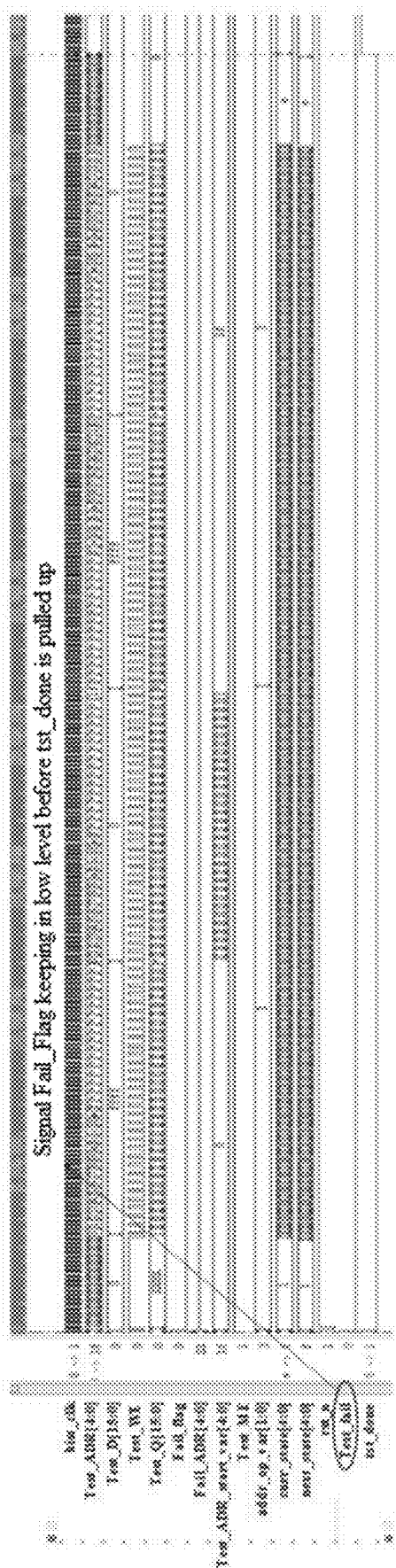
FIG. 6 illustrates a simulation waveform diagram of algorithm functions of a March C+ for detections on the $dRDF^4$ faults.
Figure 7:
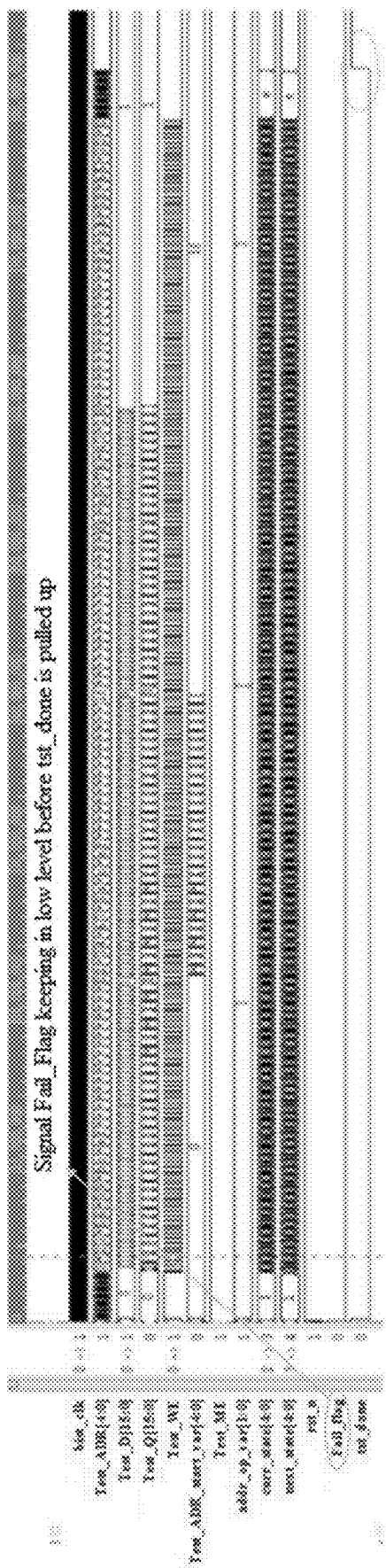
FIG. 7 illustrates a simulation waveform diagram of algorithm functions of a March RAW for detections on the $dRDF^4$ faults.
Figure 8:
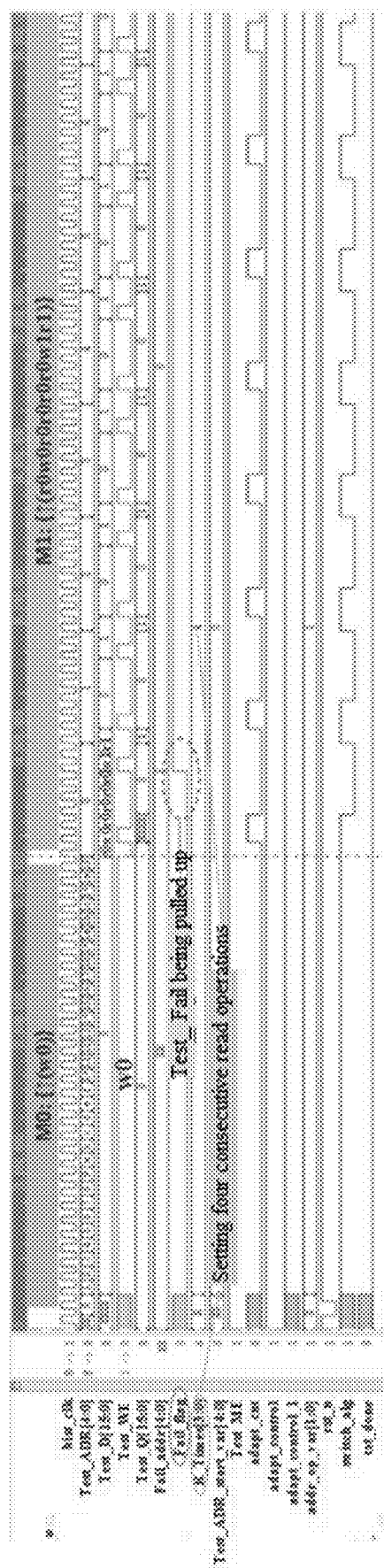
FIG. 8 illustrates a simulation waveform diagram of algorithm functions of the March Adapt-RAWC1 for detections on $dRDF^4$ faults.

Moreover, function simulations on a plurality of different algorithms are further executed, and the March C+ is selected as the representative of the static fault detection algorithms and March RAW is selected as the representative of the dynamic fault detection algorithms. After the function simulations, how a certain type of the faults is detected by the algorithms can be explained through specific read and write operations. FIG. 6 and FIG. 7 respectively illustrate the complete simulation processes for the faults dRDF$^4$ by the March C+ and the March RAW algorithms. The signals Test_Fail marked in the drawings are markers whether the faults are detected by the algorithms. It can be seen from the drawings that the signals Test_Fail are permanently at the low level, thus neither of the two comparison algorithms can detect the faults. FIG. 8 illustrates a function simulation waveform of the March Adapt-RAWC disclosed by the present disclosure to the dRDF$^4$, which clearly illustrates the specific read and write processes of M0 and M1 elements in the algorithms. The value for R_Times in the adaptive control module is set to 4, that is, four consecutive read operations are followed closely by execution after the first write operation is executed at the same address. It can be seen from the drawings that after the fourth read operation of the M1 element, Fail_flag is pulled up, which represents that faults are detected.

The detection results of different algorithms for other types of faults are consistent with those obtained by FP (as seen in Table 2 and Table 3). It can be seen from the tables that the coverage rates of the provided March Adapt-RAWC algorithm for the listed static fault types are 100% and the coverage rates of the provided March Adapt-RAWC algorithm for the listed dynamic faults are 80.9%. For a plurality of special dynamic faults, especially those that cannot be detected by the March RAW but can be detected by the March Adapt-RAWC, the detection results are marked in bold in the table. It can be seen that the disclosed available adaptive March algorithm effectively improves the fault coverage rates.

Tape-Out Verification

The code section of the reconfigurable MBIST circuit is written by using the verilog HDL language, and then the function simulations are executed by using vcs and verdi. After the functions are confirmed, DC tools are used for synthesis. The synthesized report shows that in terms of the area, the BIST circuit area which includes the March C+, the Hammer, and the March RAW algorithms is 543.48 $\mu m^2$, the area of the provided March Adapt-RAWC+ is 228.45 $\mu m^2$, and the area is reduced by 58%, which saves the circuit resources, strengthens the utilization rates for the circuit resources of the former, expands the testing functions, and dynamically adjusts the testing time complexities.

TABLE 5

Area statistics on different MBIST circuits

| BIST circuit | Area ($\mu m^2$) | Total ($\mu m^2$) |
|---|---|---|
| March C+ | 194.95 | 543.48 |
| March RAW | 225.86 | |
| Hammer | 122.67 | |
| March Adapt-RAWC | 228.45 | 228.45 |

In order to verify the functions of the provided reconfigurable MBIST circuit and the effectiveness of the adaptive algorithms in practice, the designed circuit is subjected to TSMC40 nm process chip in the present disclosure. The testing results of the chip verifies the correctness of the reconfigurable MBIST circuit and the effectiveness of the adaptive March algorithms.

What is claimed is:

1. A reconfigurable MBIST method based on an adaptive March algorithm, comprising:

inserting, after a first read operation of testing steps for sequentially reading and writing storage units in a classic March C+ testing algorithm, Hammer testing algorithm elements which are defined as $\{\downarrow(w0,r0'', r0); \downarrow(w1,r1'',r1)\}$, where $\downarrow(w0,r0'',r0)$ represents an execution of operations on writing 0, reading 0 n times, reading 0 for the storage units in a memory according to a descending order of addresses, $\downarrow(w1,r1'',r1)$ represents an execution of operations on writing 1, reading 1 n times, reading 1 for the storage units in the memory according to the descending order of the addresses, and a set value for n is configured according to user-defined instructions;

determining, by comparing PVT parameters with a fault model library, fault prone types under current PVT parameters, selecting a March algorithm that covers the fault prone types under the current PVT parameters, and generating algorithm element selection signals for reconfiguring the March algorithm;

sequentially executing, by the reconfigurable MBIST method, test steps which are defined as $\{\uparrow\downarrow(w0); \uparrow(r0,w1,r1); \uparrow(r1,w0,r0); \downarrow(r0,w1,r1); \downarrow(r1, w0,r0); \uparrow\downarrow(r0)\}$, in a case where the algorithm element selection signals merely select testing elements of the March C+ testing algorithm, where $\uparrow\downarrow(w0)$ represents an execution of operations on writing 0 for the storage units in the memory according to an ascending order or the descending order of the addresses; $\uparrow(r0,w1,r1)$ represents an execution of operations on reading 0, writing 1, reading 1 for the storage units in the memory according to the ascending order of the addresses; $\uparrow(r1,w0,r0)$ represents an execution of operations on reading 1, writing 0, reading 0 for the storage units in the memory according to the ascending order of the addresses; $\downarrow(r0,w1,r1)$ represents an execution of operations on reading 0, writing 1, reading 1 for the storage units in the memory according to the descending order of the addresses; $\downarrow(r1,w0,r0)$ represents an execution of operations on reading 1, writing 0, reading 0 for the storage units in the memory according to the descending order of the addresses; and $\uparrow\downarrow(r0)$ represents an execution of operations on reading 0 for the storage units in the memory according to the ascending order or the descending order of the addresses;

sequentially executing, by the reconfigurable MBIST method, test steps which are defined as {↑↓(w0); ↑(r0,w0,r0,r0,w1,r1); ↑(r1,w1,r1,r1,w0,r0); ↓(r0,w0,r0,r0,w1,r1); ↓(r1,w1,r1,r1,w0,r0); ↑↓(r0)}, in a case where the algorithm element selection signals select all testing elements and the set value for n is 1, where ↑↓(w0) represents an execution of operations on writing 0 for the storage units in the memory according to the ascending order or the descending order of the addresses; ↑(r0,w0,r0,r0,w1,r1) represents an execution of operations on reading 0, writing 0, reading 0, reading 0, writing 1, reading 1 for the storage units in the memory according to the ascending order of the addresses; ↑(r1,w1,r1,r1,w0,r0) represents an execution of operations on reading 1, writing 1, reading 1, reading 1, writing 0, reading 0 for the storage units in the memory according to the ascending order of the addresses; ↓(r0,w0,r0,r0,w1,r1) represents an execution of operations on reading 0, writing 0, reading 0, reading 0, writing 1, reading 1 for the storage units in the memory according to the descending order of the addresses; ↓(r1,w1,r1,r1,w0,r0) represents an execution of operations on reading 1, writing 1, reading 1, reading 1, writing 0, reading 0 for the storage units in the memory according to the descending order of the addresses; ↑↓(r0) represents an execution of operations on reading 0 for the storage units in the memory according to the ascending order or the descending order of the addresses; and sequentially executing, by the reconfigurable MBIST method, test steps which are defined as {↑↓(w0); ↑(r0,w0,r0,r0,w1,r1); ↑(r1,w1,r1,r1,w0,r0); ↓(r0,w0,r0″,r0,w1,r1); ↓(r1,w1,r1″,r1,w0,r0); ↑↓(r0)}, in a case where the algorithm element selection signals select all testing elements and the set value for n is greater than 1, where ↑↓(w0) represents an execution of operations on writing 0 for the storage units in the memory according to the ascending order or the descending order of the addresses; ↑(r0,w0,r0,r0,w1,r1) represents an execution of operations on reading 0, writing 0, reading 0, reading 0, writing 1, reading 1 for the storage units in the memory according to the ascending order of the addresses; ↑(r1,w1,r1,r1,w0,r0) represents an execution of operations on reading 1, writing 1, reading 1, reading 1, writing 0, reading 0 for the storage units in the memory according to the ascending order of the addresses; ↓(r0,w0,r0″,r0,w1,r1) represents an execution of operations on reading 0, writing 0, reading 0 n times, reading 0, writing 1, reading 1 for the storage units in the memory according to the descending order of the addresses; ↓(r1,w1,r1″,r1,w0,r0) represents an execution of operations on reading 1, writing 1, reading 1 n times, reading 1, writing 0, reading 0 for the storage units in the memory according to the descending order of the addresses; ↑↓(r0) represents an execution of operations on reading 0 for the storage units in the memory according to the ascending order or the descending order of the addresses.

2. A reconfigurable MBIST method based on an adaptive March algorithm, comprising:

inserting, after a first read operation of testing steps for sequentially reading and writing storage units in a classic March C+ testing algorithm, Hammer testing algorithm elements which are defined as {↑(w0,r0″,r0); ↑(w1,r1″,r1)}, where ↑(w0,r0″,r0) represents an execution of operations on writing 0, reading 0 n times, reading 0 for the storage units in a memory according to an ascending order of addresses, ↑(w1,r1″,r1) represents an execution of operations on writing 1, reading 1 n times, reading 1 for the storage units in the memory according to the ascending order of the addresses, and a set value for n is configured according to user-defined instructions;

determining, by comparing PVT parameters with a fault model library, fault prone types under current PVT parameters, selecting a March algorithm that covers the fault prone types under the current PVT parameters, and generating algorithm element selection signals for reconfiguring the March algorithm;

sequentially executing, by the reconfigurable MBIST method, test steps which are defined as {↑↓(w0); ↑(r0,w1,r1); ↑(r1,w0,r0); ↓(r0,w1,r1); ↓(r1,w0,r0); ↑↓(r0)}, in a case where the algorithm element selection signals merely select testing elements of the March C+ testing algorithm;

sequentially executing, by the reconfigurable MBIST method, test steps which are defined as {↑↓(w0); ↑(r0,w0,r0,r0,w1,r1); ↑(r1,w1,r1,r1,w0,r0); ↓(r0,w0,r0,r0,w1,r1); ↓(r1,w1,r1,r1,w0,r0); ↑↓(r0)}, in a case where the algorithm element selection signals select all testing elements in each of the testing steps and the set value for n is 1; and sequentially executing, by the reconfigurable MBIST method, test steps which are defined as {↑↓(w0); ↑(r0,w0,r0″,r0,w1,r1); ↑(r1,w1,r1″,r1,w0,r0); ↓(r0,w0,r0,r0,w1,r1); ↓(r1,w1,r1,r1,w0,r0); ↑↓(r0)}, in a case where the algorithm element selection signals select all testing elements in each of the testing steps and the set value for n is greater than 1.

3. A reconfigurable MBIST method based on an adaptive March algorithm, comprising:

inserting, after a first read operation of testing steps for sequentially reading and writing storage units in a classic March C+ testing algorithm, Hammer testing algorithm elements which are defined as {↓(w0,r0″,r0); ↓(w1,r1″,r1)}, and adding read and write operations at a front and a rear of the Hammer testing algorithm elements, where ↑↓(w0,r0″,r0) represents an execution of operations on writing 0, reading 0 n times, reading 0 for the storage units in a memory according to an ascending order or a descending order of addresses, ↑↓(w1,r1″,r1) represents an execution of operations on writing 1, reading 1 n times, reading 1 for the storage units in the memory according to the ascending order or the descending order of the addresses;

determining, by comparing PVT parameters with a fault model library, fault prone types under current PVT parameters, selecting a March algorithm that covers the fault prone types under the current PVT parameters, and generating algorithm element selection signals for reconfiguring the March algorithm, wherein a set value for n is configured according to user-defined instructions;

sequentially executing, by the reconfigurable MBIST method, test steps which are defined as {↑↓(w0); ↑(r0,w1,r1); ↑(r1,w0,r0); ↓(r0,w1,r1); ↓(r1,w0,r0); ↑↓(r0)}, in a case where the algorithm element selection signals merely select testing elements of the March C+ testing algorithm;

sequentially executing, by the reconfigurable MBIST method, test steps which are defined as {↑↓(w0); ↑(r0,w0,w0,r0,r0,r0,w0,r0,w1,r1); ↑(r1,w1,w1,r1,r1,r1,w1,r1,w0,r0); ↓(r0,w0,w0,r0,r0,r0,w0,r0,w1,r1); ↓(r1,w1,w1,r1,r1,r1,w1,r1,w0,r0); ↑↓(r0)}, in a case where the algorithm element selection signals select all testing elements and the set value for n is 1; and sequentially executing, by the reconfigurable MBIST method, test steps which are defined as {↑↓(w0); ↑(r0,w0,w0,r0,r0,r0,w0,r0,w1,r1); ↑(r1,w1,w1,r1,r1,r1,w1,r1,w0,r0); ↓(r0,w0,w0,r0$^n$,r0,r0,w0,r0,w1,r1); ↓(r1,w1,w1,r1$^n$,r1,r1,w1,r1,w0,r0); ↑↓(r0)} in order, in a case where the algorithm element selection signals select all testing elements and the set value for n is greater than 1.

4. A reconfigurable MBIST method based on an adaptive March algorithm, comprising:

inserting, after a first read operation of testing steps for sequentially reading and writing storage units in a classic March C+ testing algorithm, Hammer testing algorithm elements which are defined as {↑(w0,r0$^n$,r0); ↑(w1,r1$^n$,r1)}, and adding read and write operations at a front and a rear of the Hammer testing algorithm elements, where ↑↓(w0,r0$^n$,r0) represents an execution of operations on writing 0, reading 0 n times, reading 0 for the storage units in a memory according to an ascending order or a descending order of addresses, ↑↓(w1,r1$^n$,r1) represents an execution of operations on writing 1, reading 1 n times, reading 1 for the storage units in the memory according to the ascending order or the descending order of the addresses;

determining, by comparing PVT parameters with a fault model library, fault prone types under current PVT parameters, selecting a March algorithm that covers the fault prone types under the current PVT parameters, and generating algorithm element selection signals for reconfiguring the March algorithm, wherein a set value for n is configured according to user-defined instructions;

sequentially executing, by the reconfigurable MBIST method, steps which are defined as {↑↓(w0); ↑(r0,w1,r1); ↑(r1,w0,r0); ↓(r0,w1,r1); ↓(r1,w0,r0); ↑↓(r0)} in order, in a case where the algorithm element selection signals merely select testing elements of the March C+ testing algorithm;

sequentially executing, by the reconfigurable MBIST method, steps which are defined as {↑↓(w0); ↑(r0,w0,w0,r0,r0,r0,w0,r0,w1,r1); ↑(r1,w1,w1,r1,r1,r1,w1,r1,w0,r0); ↓(r0,w0,w0,r0,r0,r0,w0,r0,w1,r1); ↓(r1,w1,w1,r1,r1,r1,w1,r1,w0,r0); ↑↓(r0)} in order, in a case where the algorithm element selection signals select all testing elements in each of the testing steps and the set value for n is 1; and sequentially executing, by the reconfigurable MBIST method, steps which are defined as {↑↓(w0); ↑(r0,w0,w0,r0$^n$,r0,r0,w0,r0,w1,r1); ↑(r1,w1,w1,r1$^n$,r1,r1,w1,r1,w0,r0); ↓(r0,w0,w0,r0,r0,r0,w0,r0,w1,r1); ↓(r1,w1,w1,r1,r1,r1,w1,r1,w0,r0); ↑↓(r0)} in order, in a case where the algorithm element selection signals select all testing elements in each of the testing steps and the set value for n is greater than 1.

5. A circuit for implementing the reconfigurable MBIST method based on the adaptive March algorithm according to claim 1, comprising:

an adaptive control module, configured to collect the PVT parameters and receive the user-defined instructions, generate the algorithm element selection signals, and instructions that are configured to set the value for n in the Hammer testing algorithm elements; and a MBIST generating module, configured to receive the algorithm element selection signals and the instructions for configuring the value for n in the Hammer testing algorithm elements;

wherein the MBIST generating module is further configured to:

sequentially execute test steps which are defined as {↑↓(w0); ↑(r0,w1,r1); ↑(r1,w0,r0); ↓(r0,w1,r1); ↓(r1,w0,r0); ↑↓(r0)}, in a case where the algorithm element selection signals merely select the testing elements of the March C+ testing algorithm;

sequentially execute test steps which are defined as {↑↓(w0); ↑(r0,w0,r0,r0,w1,r1); ↑(r1,w1,r1,r1,w0,r0); ↓(r0,w0,r0,r0,w1,r1); ↓(r1,w1,r1,r1,w0,r0); ↑↓(r0)}, in a case where the algorithm element selection signals select all testing elements and the set value for n is 1;

sequentially execute test steps which are defined as {↑↓(w0); ↑(r0,w0,r0,r0,w1,r1); ↑(r1,w1,r1,r1,w0,r0); ↓(r0,w0,r0$^n$,r0,w1,r1); ↓(r1,w1,r1$^n$,r1,w0,r0); ↑↓(r0)}, in a case where the algorithm element selection signals select all testing elements and the set value for n is greater than 1;

read addresses of the storage units where execute the testing algorithm, testing data generated by the testing algorithm for the storage units, and actual output data of the storage units after executing the testing algorithm; and output a prompt signal for detecting faults of a current storage unit and the address of the current storage unit, when deviations are generated between the actual output data of the current storage unit and the testing data generated by the testing algorithm for the current storage unit.

6. The circuit for implementing the reconfigurable MBIST method based on the adaptive March algorithm according to claim 5, wherein the MBIST generating module comprises:

a reconfigurable algorithm state machine, configured to receive the algorithm element selection signals and the instructions for configuring the value for n in the Hammer testing algorithm elements; sequentially execute test steps which are defined as {↑↓(w0); ↑(r0,w1,r1); ↑(r1,w0,r0); ↓(r0,w1,r1); ↓(r1,w0,r0); ↑↓(r0)}, in a case where the algorithm element selection signals merely select the testing elements of the March C+ testing algorithm; sequentially execute test steps which are defined as {↑↓(w0); ↑(r0,w0,r0,r0,w1,r1); ↑(r1,w1,r1,r1,w0,r0); ↓(r0,w0,r0,r0,w1,r1); ↓(r1,w1,r1,r1,w0,r0); ↑↓(r0)}, in a case where the algorithm element selection signals select all testing elements and the set value for n is 1; sequentially execute test steps which are defined as {↑↓(w0); ↑(r0,w0,r0,r0,w1,r1); ↑(r1,w1,r1,r1,w0,r0); ↓(r0,w0,r0$^n$,r0,w1,r1); ↓(r1,w1,r1$^n$,r1,w0,r0); ↑↓(r0)}, in a case where the algorithm element selection signals select all testing elements and the set value for n is greater than 1;

a data generator, configured to generate the testing data generated for the storage units during an execution of the testing algorithm by the reconfigurable algorithm state machine;

an address generator, configured to generate the addresses of the storage units tested during the execution of the testing algorithm by the reconfigurable algorithm state machine;

a control generator, configured to generate enable signals for executing read and write operations on the storage units during the execution of the testing algorithm by the reconfigurable algorithm state machine;

a comparator, configured to read the actual output data of the current storage unit after executing the testing algorithm, and the testing data generated for the current storage unit during the execution of the testing algorithm by the reconfigurable algorithm state machine; and output the prompt signal for detecting the faults of the current storage unit, when deviations are generated between the actual output data of the current storage unit after executing the testing algorithm and the testing data that are generated for the current storage unit during the execution of the testing algorithm by the reconfigurable algorithm state machine; and a diagnoser, configured to read the addresses of the current storage unit where execute the testing algorithm, and output the address of the current storage unit when receiving the prompt signal for detecting the faults of the current storage unit.

\* \* \* \* \*